(12) United States Patent
Sinha et al.

(10) Patent No.: US 9,666,801 B2
(45) Date of Patent: May 30, 2017

(54) METHODS OF FORMING A NON-VOLATILE RESISTIVE OXIDE MEMORY CELL AND METHODS OF FORMING A NON-VOLATILE RESISTIVE OXIDE MEMORY ARRAY

(71) Applicant: Micron Technology, Inc., Boise, ID (US)

(72) Inventors: Nishant Sinha, Fremont, CA (US); John Smythe, Boise, ID (US); Bhaskar Srinivasan, Allen, TX (US); Gurtej S. Sandhu, Boise, ID (US); Joseph Neil Greeley, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/156,105

(22) Filed: May 16, 2016

(65) Prior Publication Data
US 2016/0260899 A1    Sep. 8, 2016

Related U.S. Application Data

(62) Division of application No. 12/166,604, filed on Jul. 2, 2008, now Pat. No. 9,343,665.

(51) Int. Cl.
*H01L 45/00* (2006.01)
*H01L 27/24* (2006.01)

(52) U.S. Cl.
CPC ...... *H01L 45/1683* (2013.01); *H01L 27/2472* (2013.01); *H01L 45/04* (2013.01);
(Continued)

(58) Field of Classification Search
CPC  H01L 27/2463–27/249; H01L 45/00–45/1691
See application file for complete search history.

(56) References Cited

U.S. PATENT DOCUMENTS 4,715,685 A   12/1987  Yaniv et al.
4,964,080 A   10/1990  Tzeng
(Continued)

FOREIGN PATENT DOCUMENTS

CN   1339159   3/2002
CN   1444284   9/2003
(Continued)

OTHER PUBLICATIONS

CN 200880124714.6 SR Trans., Jul. 9, 2012, Micron Technology, Inc.
(Continued)

*Primary Examiner* — Bryan Junge
(74) *Attorney, Agent, or Firm* — Wells St. John P.S.

(57) ABSTRACT

A method of forming a non-volatile resistive oxide memory cell includes forming a first conductive electrode of the memory cell as part of a substrate. Metal oxide-comprising material is formed over the first conductive electrode. Etch stop material is deposited over the metal oxide-comprising material. Conductive material is deposited over the etch stop material. A second conductive electrode of the memory cell which comprises the conductive material received is formed over the etch stop material. Such includes etching through the conductive material to stop relative to the etch stop material and forming the non-volatile resistive oxide memory cell to comprise the first and second conductive electrodes having both the metal oxide-comprising material and the etch stop material therebetween. Other implementations are contemplated.

17 Claims, 9 Drawing Sheets

(52) U.S. Cl.
CPC ........ *H01L 45/085* (2013.01); *H01L 45/1233* (2013.01); *H01L 45/1266* (2013.01); *H01L 45/146* (2013.01); *H01L 45/147* (2013.01); *H01L 45/16* (2013.01)

(56) References Cited

U.S. PATENT DOCUMENTS

| | | | |
|---|---|---|---|
| 5,049,970 | A | 9/1991 | Tanaka et al. |
| 5,122,476 | A | 6/1992 | Fazan et al. |
| 6,034,882 | A | 3/2000 | Johnson et al. |
| 6,218,696 | B1 | 4/2001 | Radius |
| 6,432,767 | B2 | 8/2002 | Torii et al. |
| 6,524,867 | B2 | 2/2003 | Yang et al. |
| 6,552,952 | B2 | 4/2003 | Pascucci |
| 6,687,147 | B2 | 2/2004 | Frickie et al. |
| 6,693,821 | B2 | 2/2004 | Hsu et al. |
| 6,693,846 | B2 | 2/2004 | Fibranz |
| 6,717,881 | B2 | 4/2004 | Ooishi |
| 6,753,561 | B1 | 6/2004 | Rinerson et al. |
| 6,753,562 | B1 | 6/2004 | Hsu et al. |
| 6,757,188 | B2 | 6/2004 | Perner et al. |
| 6,778,421 | B2 | 8/2004 | Tran |
| 6,785,159 | B2 | 8/2004 | Tuttle |
| 6,806,531 | B1 | 10/2004 | Chen et al. |
| 6,834,008 | B2 | 12/2004 | Rinerson et al. |
| 6,873,544 | B2 | 3/2005 | Perner et al. |
| 6,906,837 | B2 | 6/2005 | Hsu et al. |
| 6,930,324 | B2 | 8/2005 | Kowalski et al. |
| 6,940,113 | B2 | 9/2005 | Hsu et al. |
| 6,946,702 | B2 | 9/2005 | Jang |
| 6,950,369 | B2 | 9/2005 | Kunikiyo et al. |
| 6,955,992 | B2 | 10/2005 | Zhang et al. |
| 6,958,273 | B2 | 10/2005 | Chen et al. |
| 6,961,258 | B2 | 11/2005 | Lowrey |
| 6,970,375 | B2 | 11/2005 | Rinerson et al. |
| 6,972,211 | B2 | 12/2005 | Hsu et al. |
| 6,985,374 | B2 | 1/2006 | Yamamura |
| 7,002,197 | B2 | 2/2006 | Perner et al. |
| 7,005,350 | B2 | 2/2006 | Walker et al. |
| 7,009,278 | B2 | 3/2006 | Hsu |
| 7,026,911 | B2 | 4/2006 | Aono et al. |
| 7,029,924 | B2 | 4/2006 | Hsu et al. |
| 7,029,925 | B2 | 4/2006 | Celii et al. |
| 7,035,141 | B1 | 4/2006 | Tripsas et al. |
| 7,046,550 | B1 | 5/2006 | Reohr et al. |
| 7,050,316 | B1 | 5/2006 | Lin et al. |
| 7,067,862 | B2 | 6/2006 | Rinerson et al. |
| 7,085,167 | B2 | 8/2006 | Lee et al. |
| 7,098,438 | B1 | 8/2006 | Frazier |
| 7,109,544 | B2 | 9/2006 | Schoelesser et al. |
| 7,123,535 | B2 | 10/2006 | Kurotsuchi et al. |
| 7,149,108 | B2 | 12/2006 | Rinerson et al. |
| 7,167,387 | B2 | 1/2007 | Sugita et al. |
| 7,180,160 | B2 | 2/2007 | Ferrant et al. |
| 7,187,201 | B1 | 3/2007 | Trimberger |
| 7,193,267 | B2 | 3/2007 | Hsu et al. |
| 7,205,238 | B2 | 4/2007 | Pan et al. |
| 7,233,024 | B2 | 6/2007 | Scheuerlein et al. |
| 7,236,389 | B2 | 6/2007 | Hsu |
| 7,247,876 | B2 | 7/2007 | Lowrey |
| 7,273,791 | B2 | 9/2007 | Basceri et al. |
| 7,323,349 | B2 | 1/2008 | Hsu et al. |
| 7,335,906 | B2 | 2/2008 | Toda |
| 7,388,775 | B2 | 6/2008 | Bedeschi et al. |
| 7,393,785 | B2 | 7/2008 | Uhlenbrock et al. |
| 7,405,967 | B2 | 7/2008 | Kozicki et al. |
| 7,459,715 | B2 | 12/2008 | Toda et al. |
| 7,459,716 | B2 | 12/2008 | Toda et al. |
| 7,465,675 | B2 | 12/2008 | Koh |
| 7,473,982 | B2 | 1/2009 | Aono et al. |
| 7,489,552 | B2 | 2/2009 | Kurotsuchi et al. |
| 7,525,410 | B2 | 4/2009 | Aono et al. |
| 7,538,338 | B2 | 5/2009 | Rinerson et al. |
| 7,544,987 | B2 | 6/2009 | Lu et al. |
| 7,557,424 | B2 | 7/2009 | Wong et al. |
| 7,560,815 | B1 | 7/2009 | Vaartstra et al. |
| 7,570,511 | B2 | 8/2009 | Cho et al. |
| 7,639,523 | B2 | 12/2009 | Celinska et al. |
| 7,666,526 | B2 | 2/2010 | Chen et al. |
| 7,671,417 | B2 | 3/2010 | Yoshida et al. |
| 7,679,812 | B2 | 3/2010 | Sasagawa et al. |
| 7,687,793 | B2 | 3/2010 | Harshfield et al. |
| 7,687,840 | B2 | 3/2010 | Shinmura |
| 7,696,077 | B2 | 4/2010 | Liu |
| 7,700,935 | B2 | 4/2010 | Kim et al. |
| 7,727,908 | B2 | 6/2010 | Ahn et al. |
| 7,751,163 | B2 | 7/2010 | Duch et al. |
| 7,755,076 | B2 | 7/2010 | Lung |
| 7,768,812 | B2 | 8/2010 | Liu |
| 7,772,580 | B2 | 8/2010 | Hofmann et al. |
| 7,777,215 | B2 | 8/2010 | Chien et al. |
| 7,799,672 | B2 | 9/2010 | Hashimoto et al. |
| 7,807,995 | B2 | 10/2010 | Mikawa et al. |
| 7,838,861 | B2 | 11/2010 | Klostermann |
| 7,842,991 | B2 | 11/2010 | Cho et al. |
| 7,864,568 | B2 | 1/2011 | Fujisaki et al. |
| 7,898,839 | B2 | 3/2011 | Aoki |
| 7,907,436 | B2 | 3/2011 | Maejima et al. |
| 7,910,909 | B2 | 3/2011 | Kim et al. |
| 7,948,784 | B2 | 5/2011 | Kajigaya |
| 7,952,914 | B2 | 5/2011 | Baek et al. |
| 7,990,754 | B2 | 8/2011 | Azuma et al. |
| 8,021,897 | B2 | 9/2011 | Sills et al. |
| 8,034,655 | B2 | 10/2011 | Smythe et al. |
| 8,043,926 | B2 | 10/2011 | Cho et al. |
| 8,048,755 | B2 | 11/2011 | Sandhu et al. |
| 8,094,477 | B2 | 1/2012 | Maejima |
| 8,098,520 | B2 | 1/2012 | Seigler et al. |
| 8,106,375 | B2 | 1/2012 | Chen et al. |
| 8,114,468 | B2 | 2/2012 | Sandhu et al. |
| 8,124,968 | B2 | 2/2012 | Koo et al. |
| 8,154,908 | B2 | 4/2012 | Maejima et al. |
| 8,154,909 | B2 | 4/2012 | Azuma et al. |
| 8,295,077 | B2 | 10/2012 | Murooka |
| 8,355,274 | B2 | 1/2013 | Arita et al. |
| 8,411,477 | B2 | 4/2013 | Tang et al. |
| 8,427,859 | B2 | 4/2013 | Sandhu et al. |
| 8,431,458 | B2 | 4/2013 | Sills et al. |
| 8,436,414 | B2 | 5/2013 | Tanaka et al. |
| 8,536,556 | B2 | 9/2013 | Fukumizu |
| 8,537,592 | B2 | 9/2013 | Liu |
| 8,542,513 | B2 | 9/2013 | Tang et al. |
| 8,611,121 | B2 | 12/2013 | Ahn et al. |
| 8,652,909 | B2 | 2/2014 | Sills et al. |
| 8,743,589 | B2 | 6/2014 | Sandhu et al. |
| 8,791,447 | B2 | 7/2014 | Liu et al. |
| 8,854,863 | B2 | 10/2014 | Liu |
| 2002/0018355 | A1 | 2/2002 | Johnson et al. |
| 2002/0034117 | A1 | 3/2002 | Okazawa |
| 2002/0079524 | A1 | 6/2002 | Dennison |
| 2002/0098676 | A1* | 7/2002 | Ning ............... B82Y 10/00 438/622 |
| 2002/0196695 | A1 | 12/2002 | Pascucci |
| 2003/0031047 | A1 | 2/2003 | Anthony et al. |
| 2003/0086313 | A1 | 5/2003 | Asao |
| 2003/0174042 | A1 | 9/2003 | Aono et al. |
| 2003/0174570 | A1 | 9/2003 | Oishi |
| 2003/0185049 | A1 | 10/2003 | Fricke et al. |
| 2003/0218902 | A1 | 11/2003 | Perner et al. |
| 2003/0218929 | A1 | 11/2003 | Fibranz |
| 2003/0223283 | A1 | 12/2003 | Kunikiyo |
| 2004/0002186 | A1 | 1/2004 | Vyvoda et al. |
| 2004/0090841 | A1 | 5/2004 | Perner et al. |
| 2004/0100835 | A1 | 5/2004 | Sugibayashi et al. |
| 2004/0108528 | A1 | 6/2004 | Hsu et al. |
| 2004/0124407 | A1 | 7/2004 | Kozicki et al. |
| 2004/0188714 | A1 | 9/2004 | Scheuerlein |
| 2004/0245547 | A1 | 12/2004 | Stipe |
| 2005/0001257 | A1 | 1/2005 | Schoelesser et al. |
| 2005/0014325 | A1 | 1/2005 | Aono et al. |
| 2005/0032100 | A1 | 2/2005 | Heath et al. |
| 2005/0054119 | A1 | 3/2005 | Hsu et al. |
| 2005/0128799 | A1 | 6/2005 | Kurotsuchi et al. |
| 2005/0161747 | A1 | 7/2005 | Lung et al. |

(56) References Cited

U.S. PATENT DOCUMENTS

| | | |
|---|---|---|
| 2005/0174835 A1 | 8/2005 | Rinerson et al. |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0275003 A1 | 12/2005 | Shinmura |
| 2005/0287741 A1 | 12/2005 | Ding |
| 2006/0023498 A1 | 2/2006 | Asao |
| 2006/0027893 A1* | 2/2006 | Meijer .................... H01L 27/20 257/536 |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1* | 9/2006 | Baek .................... G11C 11/16 365/158 |
| 2006/0258079 A1 | 11/2006 | Lung et al. |
| 2006/0258089 A1 | 11/2006 | Chung-Zen |
| 2006/0274593 A1 | 12/2006 | Kurotsuchi et al. |
| 2006/0284157 A1 | 12/2006 | Chen et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0034848 A1 | 2/2007 | Liu |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0171706 A1 | 7/2007 | Fuji |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0070409 A1* | 3/2008 | Park .................... H01L 21/31116 438/675 |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz De Araujo et al. |
| 2008/0123390 A1 | 5/2008 | Kim et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0185687 A1 | 8/2008 | Hong et al. |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0097295 A1 | 4/2009 | Morimoto |
| 2009/0141547 A1 | 6/2009 | Jin et al. |
| 2009/0168495 A1 | 7/2009 | Aoki |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0321878 A1 | 12/2009 | Koo et al. |
| 2009/0323385 A1 | 12/2009 | Scheuerlin et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0061132 A1 | 3/2010 | Fujisaki et al. |
| 2010/0065836 A1 | 3/2010 | Lee et al. |
| 2010/0072452 A1 | 3/2010 | Kim et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0172171 A1 | 7/2010 | Azuma et al. |
| 2010/0176368 A1 | 7/2010 | Ko et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |

(56) References Cited

U.S. PATENT DOCUMENTS

| | | |
|---|---|---|
| 2010/0232200 A1 | 9/2010 | Shepard |
| 2010/0237442 A1 | 9/2010 | Li et al. |
| 2010/0243980 A1 | 9/2010 | Fukumizu |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259961 A1 | 10/2010 | Fasoli et al. |
| 2010/0259962 A1 | 10/2010 | Yan et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0205783 A1 | 8/2011 | Murooka |
| 2011/0249486 A1 | 10/2011 | Azuma et al. |
| 2011/0261606 A1 | 10/2011 | Sandhu et al. |
| 2011/0261607 A1 | 10/2011 | Tang et al. |
| 2011/0309322 A1 | 12/2011 | Hwang et al. |
| 2012/0119180 A1 | 5/2012 | Koo et al. |
| 2012/0140542 A1 | 6/2012 | Liu |
| 2012/0147648 A1 | 6/2012 | Scheuerlein |
| 2012/0164798 A1 | 6/2012 | Sills et al. |
| 2012/0187363 A1 | 7/2012 | Liu et al. |
| 2012/0248399 A1 | 10/2012 | Sasago et al. |
| 2013/0021836 A1 | 1/2013 | Liu |
| 2014/0247640 A1 | 9/2014 | Liu |

FOREIGN PATENT DOCUMENTS

| | | | |
|---|---|---|---|
| CN | 1459792 | 12/2003 | |
| CN | 1624803 | 6/2005 | |
| CN | 101005113 | 12/2006 | |
| CN | 101051670 | 4/2007 | |
| CN | 101034732 | 9/2007 | |
| CN | 101256831 | 9/2008 | |
| CN | 101350360 | 1/2009 | |
| CN | 101546602 | 9/2009 | |
| CN | 101840995 | 9/2010 | |
| EP | 0117045 | 8/1984 | |
| EP | 1796903 | 9/2006 | |
| GB | 1266513 | 3/1972 | |
| JP | 2005-175457 | 6/2005 | |
| JP | 2005-353779 | 12/2005 | |
| JP | 2006-032729 | 2/2006 | |
| JP | 2006-040981 | 2/2006 | |
| JP | 2006-074028 | 3/2006 | |
| JP | 2006-121044 | 5/2006 | |
| JP | WO 2008013086 A1 * | 1/2008 | ........... H01L 27/101 |
| JP | 2008-135744 | 6/2008 | |
| JP | 2008-192995 | 8/2008 | |
| JP | 2009-081251 | 4/2009 | |
| JP | 2009-163867 | 7/2009 | |
| JP | 2009-267411 | 11/2009 | |
| JP | 2010-009669 | 1/2010 | |
| JP | 2010-010688 | 1/2010 | |
| JP | 2010-192569 | 9/2010 | |
| JP | 2010-192646 | 9/2010 | |
| JP | 2010-232214 | 10/2010 | |
| JP | 2010-263211 | 11/2010 | |
| KR | 2003-0048421 | 6/2003 | |
| KR | 2005-0008353 | 1/2005 | |
| KR | 2006-0087882 | 8/2006 | |
| KR | 10-0751736 | 8/2007 | |
| KR | 2007-0111840 | 11/2007 | |
| KR | 2007-0118865 | 12/2007 | |
| KR | 2009-0109804 | 10/2009 | |
| KR | 2010-0078808 | 7/2010 | |
| KR | 2010-0083402 | 7/2010 | |
| WO | WO 2006/003620 | 1/2006 | |
| WO | WO 2008/029446 | 3/2008 | |
| WO | WO 2009/127187 | 10/2009 | |
| WO | WO 2010/068221 | 6/2010 | |
| WO | WO 2010/082922 | 7/2010 | |
| WO | WO 2010/082923 | 7/2010 | |
| WO | WO 2010/082928 | 7/2010 | |
| WO | WO 2010/085241 | 7/2010 | |
| WO | WO 2010/087854 | 8/2010 | |
| WO | WO 2010/101340 | 9/2010 | |
| WO | WO 2010/117911 | 10/2010 | |

OTHER PUBLICATIONS

CN 201180027954.6 SR Trans., May 14, 2014, Micron Technology, Inc.

CN 201180057866.0 SR Trans., Nov. 25, 2015, Micron Technology, Inc.

CN 201180065042.8 SR Trans., May 22, 2015, Micron Technology, Inc.

EP 11792836 Search Report, Dec. 16, 2013, Micron Technology, Inc.

EP 11834802 Annex to EP SR, Mar. 4, 2015, Micron Technology, Inc.

EP 11845727.4 Search Report, Nov. 20, 2014, Micron Technology, Inc.

EP 14171745 Extended SR, Mar. 13, 2015, Micron Technology, Inc.

WO PCT/US2008/084422 IPRP, Jul. 20, 2010, Micron Technology, Inc.

WO PCT/US2008/084422 Search Rept., Mar. 19, 2009, Micron Technology, Inc.

WO PCT/US2008/084422 Writ. Opin., Mar. 19, 2009, Micron Technology, Inc.

WO PCT/US2011/035601 IPRP, Dec. 10, 2012, Micron Technology, Inc.

WO PCT/US2011/035601 Search Rept., Nov. 21, 2011, Micron Technology, Inc.

WO PCT/US2011/035601 Writ. Opin., Nov. 21, 2011, Micron Technology, Inc.

WO PCT/US2011/051785 IPRP, Apr. 23, 2013, Micron Technology, Inc.

WO PCT/US2011/051785 Search Rept., Apr. 10, 2012, Micron Technology, Inc.

WO PCT/US0211/051785 Writ. Opin., Apr. 10, 2012, Micron Technology, Inc.

WO PCT/US2011/059095 IPRP, Jun. 4, 2013, Micron Technology, Inc.

WO PCT/US2011/059095 Search Rept., May 21, 2012, Micron Technology, Inc.

WO PCT/US2011/059095 Writ. Opin., May 21, 2012, Micron Technology, Inc.

WO PCT/US2011/066770 IPRP, Jul. 23, 2013, Micron Technology, Inc.

WO PCT/US2011/066770 Search Rept., Sep. 11, 2012, Micron Technology, Inc.

WO PCT/US2011/066770 Writ. Opin., Sep. 11, 2012, Micron Technology, Inc.

WO PCT/US2012/021168 Search Rept., Jul. 24, 2012, Micron Technology, Inc.

WO PCT/US2012/021168 Writ. Opin., Jul. 24, 2012, Micron Technology, Inc.

TW 097147549 SR Translation, May 20, 2013, Micron Technology, Inc.

TW 100119681 SR Translation, Aug. 18, 2013, Micron Technology, Inc.

TW 100135681 SR Translation, Oct. 30, 2013, Micron Technology, Inc.

TW 100142963 SR Translation, Aug. 13, 2014, Micron Technology, Inc.

TW 101102280 SR Translation, Aug. 25, 2014, Micron Technology, Inc.

Baek et al., "Multi-Layer Cross-Point Binary Oxide Resistive Memory (OxRRAM) for Post-NAND Storage Application", IEEE 2005, United States, 4 pages.

Bedeschi et al., "A Bipolar-Selected Phase Change Memory Featuring Multi-Level Cell Storage", IEEE Journal of Solid-State Circuits vol. 44, No. 1, Jan. 2009, United States, pp. 217-227.

Chen et al., "Non-Volatile Resistive Switching for Advanced Memory Applications", IEEE, 2005, United States, 4 pages.

(56) References Cited

OTHER PUBLICATIONS

Chen et al., "Perovskite RRAM Devices with Metal/Insulator/PCMO/Metal Heterostructures", IEEE, 2005, United States, pp. 125-128.
Choi et al., "Defect Structure and Electrical Properties of Single-Crystal Ba0.03SR0.97TiO3", Journal of the American Ceramic Society vol. 71, No. 4, 1988, United Kingdom, pp. 201-205.
Courtade et al., "Microstructure and Resistance Switching in NiO Binary Oxide Films Obtained from Ni Oxidation", IEEE, 2006, United States, pp. 94-99.
Higaki et al., "Effects of Gas Phase Absorption into Si Substrates on Plasma Doping Process", IEEE 33rd Conference on European Solid-State Device Research, Sep. 16-18, 2003, Portugal, 4 pages.
Ho et al., "A Highly Reliable Self-Aligned Graded Oxide WOx Resistance Memory: Conduction Mechanisms and Reliability", IEEE 2007 Symposium on VLSI Technology Digest of Technical Papers, Kyoto, pp. 228-229.
Hosoi et al., "High Speed Unipolar Switching Resistance RAM (RRAM) Technology", IEEE International Electron Devices Meeting, Dec. 2006, United States, 4 pages.
Hudgens et al., "Overview of Phase-Change Chalcogenide Non-volatile Memory Technology", MRS Bulletin, Nov. 2004, United States, pp. 829-832.
Ignatiev et al., "Resistance Non-volatile Memory-RRAM", Materials Research Society Symposium Proceedings vol. 997, 2007, United States, 9 pages.
Karg et al., "Nanoscale Resistive Memory Device using SrTiO3 Films", IEEE, 2007 United States, pp. 68-70.
Kau et al., "A Stackable Cross Point Phase Change Memory", IEEE, 2009, United States, pp. 27.1.1-27.1.4.
Komori et al., "Disturbless Flash Memory due to High Boost Efficiency on BiCS Structure and Optimal Memory Film Stack for Ultra High Density Storage Device", IEEE International Electron Devices Meeting, Dec. 15-17, 2008, United States, pp. 851-854.
Kooij et al., "Photoselective Metal Deposition on Amorphous Silicon p-i-n Solar Cells", Electrochemical Society Letters, Journal of the Electrochemical Society vol. 44, No. 10, Oct. 1997, United States, pp. L271-L272.
Kozicki et al., "Non-Volatile Memory Based on Solid Electrolytes", IEEE Non-Volatile Memory Technology Symposium, Nov. 15-17, 2004, United States, 8 pages.
Kozicki, "Memory Devices Based on Solid Electrolytes", Materials Research Society Symposium Proceedings vol. 997, 2007, United States, 10 pages.
Lee et al., "2-Stack 1D-1R Cross-Point Structure with Oxide Diodes as Switch Elements for High Density Resistance RAM Appilcations", IEEE, 2007, United States, pp. 771-774.
Lee et al., "Resistance Switching of Al Doped ZnO for Non Volatile Memory Applications", IEEE 21st Non-Volatile Semiconductor Memory Workshop, 2006, United States, 2 pages.
Lin et al., "Effect of Top Electrode Material on Resistive Switching Properties of ZrO2 Film Memory Devices", IEEE Electron Device Letters vol. 28, No. 5, May 2007, United States, pp. 366-368.
Meyer et al., "Oxide Dual-Layer Memory Element for Scalable Non-Volatile Cross-Point Memory Technology", IEEE, 2008, United States, 5 pages.
Miyashita et al., "A Novel Bit-Line Process using Poly-Si Masked Dual-Damascene (PMDD) for 0.13 μm DRAMs and Beyond", IEEE, 2000, United States, pp. 15.4.1-15.4.4.
Muller et al., "Emerging Non-Volatile Memory Technologies", IEEE, 2003, United States, pp. 37-44.
Oh et al., "Full Integration of Highly Manufacturable 512Mb PRAM based on 90nm Technology", IEEE, 2006, United States, 4 pages.
Pein et al., "Performance of the 3-D PENCIL Flash EPROM Cell and Memory Array", IEEE Transaction on Electron Devices vol. 42, No. 11, Nov. 1995, United States, pp. 1982-1991.
Pellizzer et al., "A 90nm Phase Change Memory Technology for Stand-Alone Non-Volatile Memory Applications", IEEE Symposium on VLSI Technology 2006 Digest of Technical Papers, United States, 2 pages. Abstract Only.
Pirovano et al., "Self-Aligned μTrench Phase-Change Memory Cell Architecture for 90nm Technology and Beyond", IEEE 37th European Solid State Device Research Conference, Sep. 11-13, 2007, Munich, 1 page. Abstract Only.
Scheck et al., "Selective Metal Electrodeposition Through Doping Modulation of Semiconductor Surfaces", Applied Physics Letters vol. 86, 2005, United States, 3 pages.
Wikipedia, Despotuli et al., "Programmable Metallization Cell", Dec. 11, 2007, Place of Publication: Internet, pp. 1-4.
Wikipedia; "Programmable Metallization Cell", Dec. 11, 2007; Downloaded Dec. 13, 2011; http://en.wikipedia.org/wiki/Programmable_metallization_cell. 4 pages.
Wuttig, "Phase Change Materials: Towards a Universal Memory?", Nature Materials vol. 4, Apr. 2005, United Kingdom, pp. 265-266.
Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Applied Physics vol. 97, 2005, United States, 4 pages.
Yih et al., "SiC/Si Heterojunction Diodes Fabricated by Self-Selective and by Blanket Rapid Thermal Chemical Vapor Deposition", IEEE Transactions on Electron Devices vol. 41, No. 3, Mar. 1994, United States, pp. 281-287.
Yoon et al., "Vertical Cross-Point Resistance Change Memory for Ultra-High Density Non-Volatile Memory Applications", IEEE Symposium on VLSI Technology Digest of Technical Papers, Jun. 16-18, 2009, United States, pp. 26-27.
Yu et al., "Structure Effects on Resistive Switching of Al/TiOx/Al Devices for RRAM Applications", IEEE Electron Device Letters vol. 29, No. 4, Apr. 2008, United States, pp. 331-333.
EP 14171745.4 Exam Report, Dec. 2, 2016, Micron Technology, Inc.

* cited by examiner

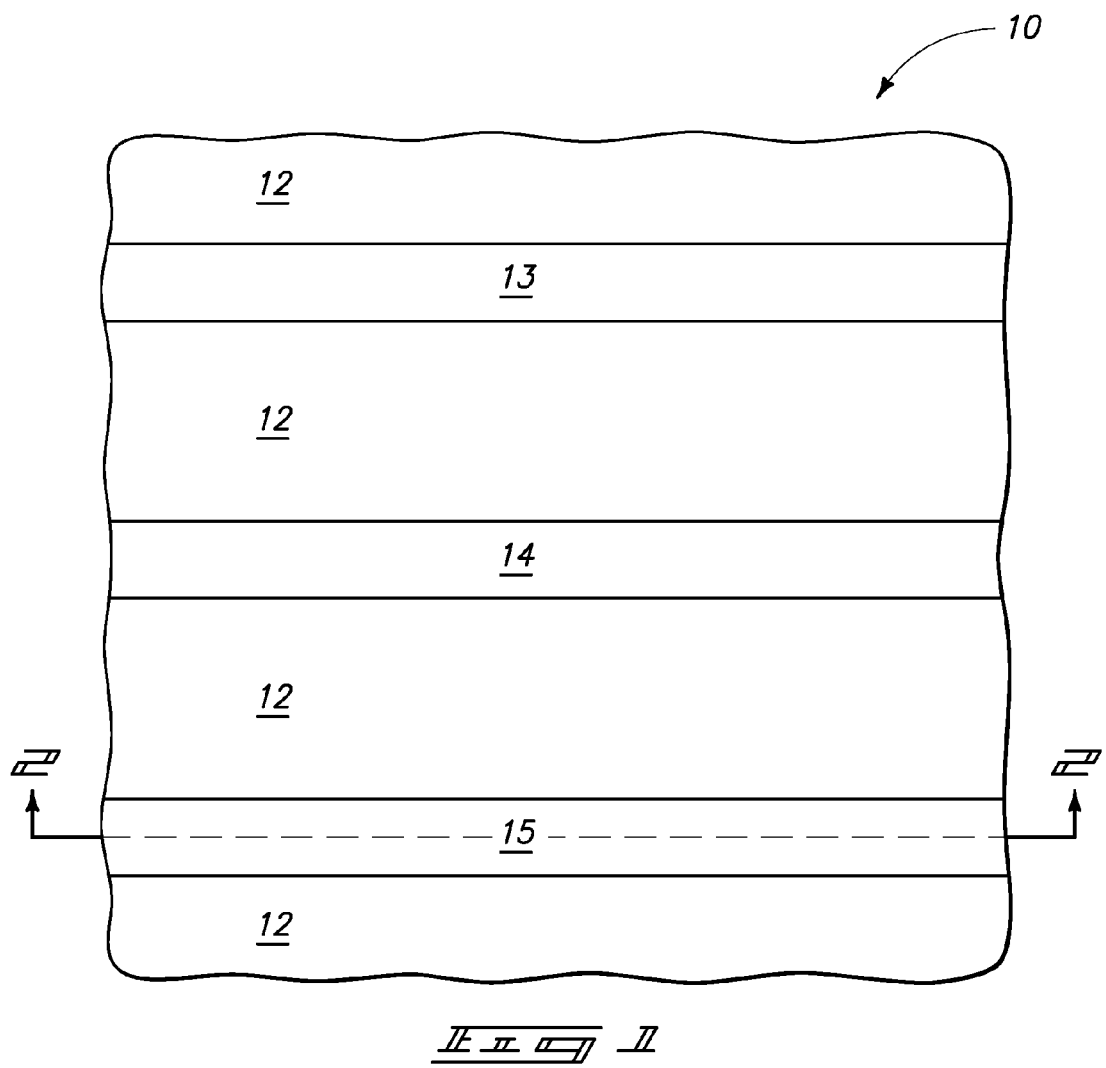
_FIG. 1_
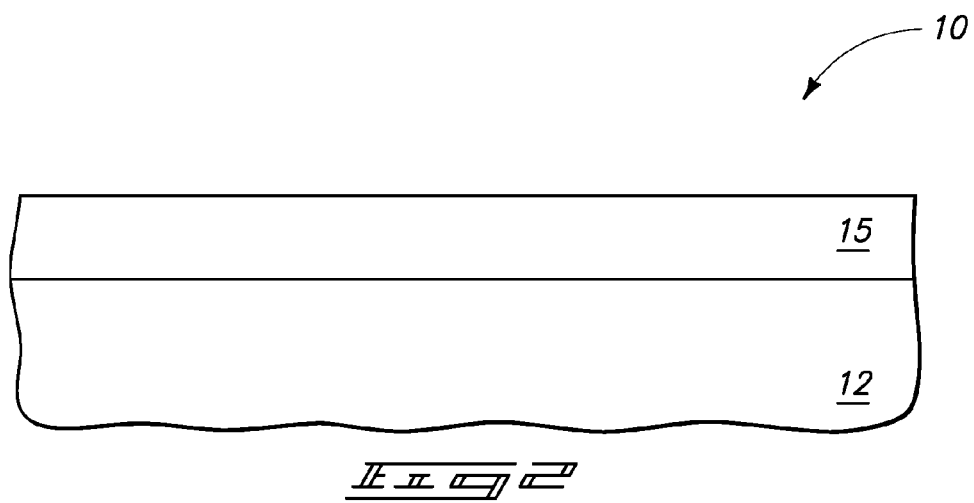
_FIG. 2_

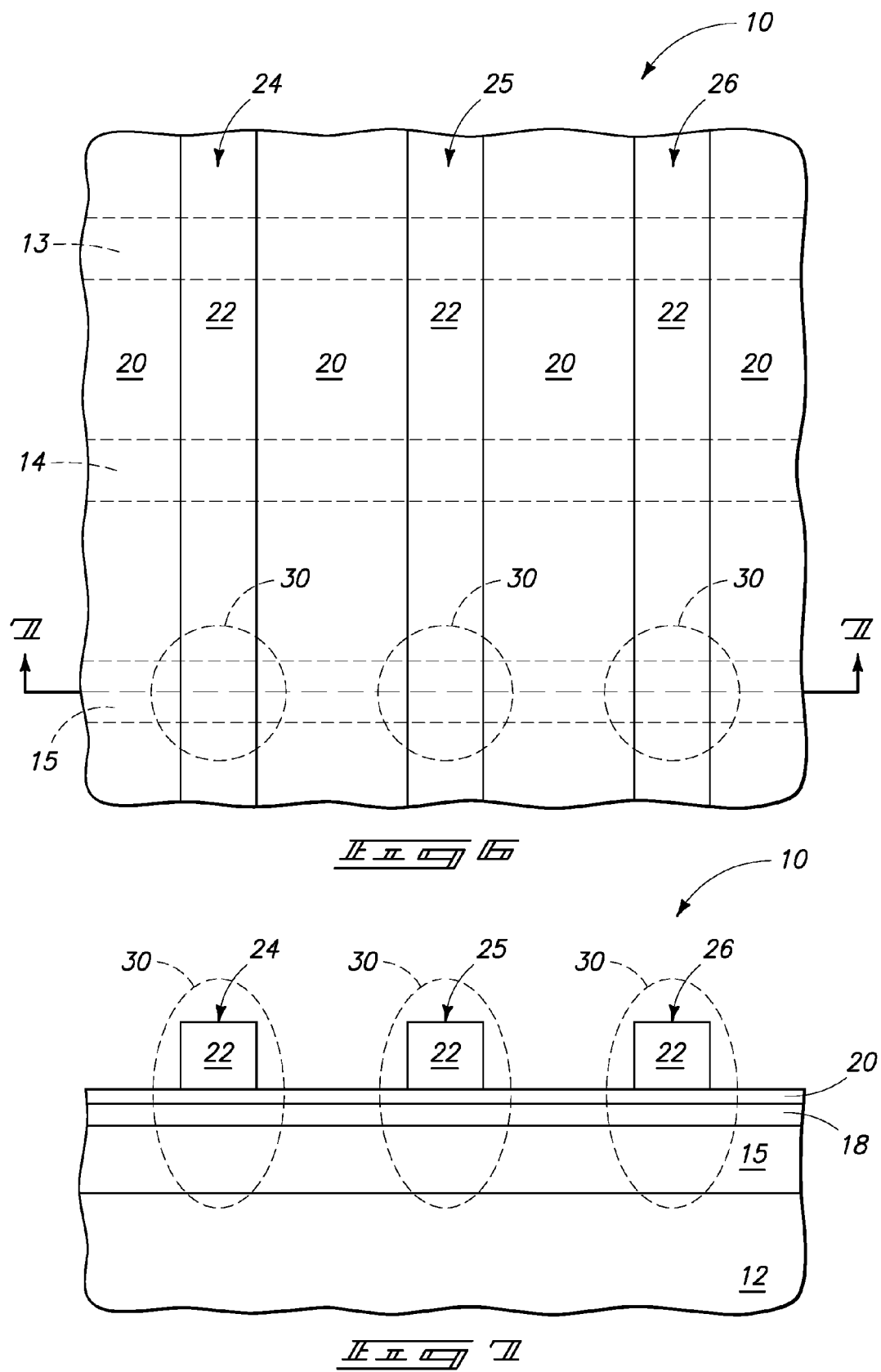

METHODS OF FORMING A NON-VOLATILE RESISTIVE OXIDE MEMORY CELL AND METHODS OF FORMING A NON-VOLATILE RESISTIVE OXIDE MEMORY ARRAY

RELATED PATENT DATA

This patent resulted from a divisional application of U.S. patent application Ser. No. 12/166,604 which was filed Jul. 2, 2008, and which is incorporated by reference herein.

TECHNICAL FIELD

Embodiments disclosed herein pertain to methods of forming a non-volatile resistive oxide memory cell and to methods of forming a non-volatile resistive oxide memory array.

BACKGROUND

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires to be refreshed/rewritten, and in many instances including multiple times per second. Regardless, the smallest unit in each array is termed as a memory cell and is configured to retain or store memory in at least two different selectable states. In a binary system, the storage conditions are considered as either a "0" or a "1". Further, some individual memory cells can be configured to store more than two levels of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received there-between. Example materials include metal oxides which may or may not be homogenous, and may or may not contain other materials therewith. Regardless, the collective material received between the two electrodes is selected or designed to be configured in a selected one of at least two different resistive states to enable storing of information by an individual memory cell. When configured in one extreme of the resistive states, the material may have a high resistance to electrical current. In contrast in the other extreme, when configured in another resistive state, the material may have a low resistance to electrical current. Existing and yet-to-be developed memory cells might also be configured to have one or more additional possible stable resistive states in between a highest and a lowest resistance state. Regardless, the resistive state in which the programmable material is configured may be changed using electrical signals. For example, if the material is in a high-resistance state, the material may be configured to be in a low resistance state by applying a voltage across the material.

The programmed resistive state is designed to be persistent in non-volatile memory. For example, once configured in a resistive state, the material stays in such resistive state even if neither a current nor a voltage is applied to the material. Further, the configuration of the material may be repeatedly changed from one resistance state to another for programming the memory cell into different of at least two resistive states. Upon such programming, the resistive state of the material can be determined by appropriate signals applied to one or both of the two electrodes between which the material is received.

Certain metal oxides can be used as such materials in resistive memory cells. During fabrication, the materials which make up the memory elements are deposited and patterned to produce a desired finished shape and construction of the individual memory cells in an array of such cells. Accordingly, a conductive material is deposited for one of the electrodes, followed by deposition of at least some metal oxide for the programmable region, and followed by deposition of more conductive material for the other electrode of the memory cell. Often, the first and second conductive layers are fabricated as elongated conductive lines which run generally parallel an outermost major surface of the substrate upon which such are fabricated, yet generally orthogonal relative to one another.

Regardless, the three different regions of the memory cell are often patterned by etching using multiple masking and etching steps. Such typically include anisotropic plasma etching through the conductive outer electrode material inwardly at least to the metal oxide which will be the programmable region of the memory cell. Further, usually subsequent plasma etching is conducted through the metal oxide to the lower electrode conductive material. Also, the metal oxide may be exposed to plasma-based post-etch cleans. Regardless, exposure of the metal oxide material to plasma etching can adversely affect the operation of the memory cell in that composition and/or structure of the metal oxide material may be modified in an unpredictable manner.

BRIEF DESCRIPTION OF THE DRAWINGS

FIG. 1 is a diagrammatic top plan view of a semiconductor substrate fragment in process in accordance with an embodiment of the invention.

FIG. 2 is a cross sectional view of the FIG. 1 substrate fragment comprising a planar cross section taken through line 2-2 in FIG. 1.

FIG. 6 is a diagrammatic top plan view of the FIG. 1 semiconductor substrate fragment at a processing step subsequent to that shown by FIG. 5.

FIG. 7 is a cross sectional view of the FIG. 6 substrate fragment comprising a planar cross section taken through line 7-7 in FIG. 6.

DETAILED DESCRIPTION OF EXAMPLE EMBODIMENTS

Figure 3:
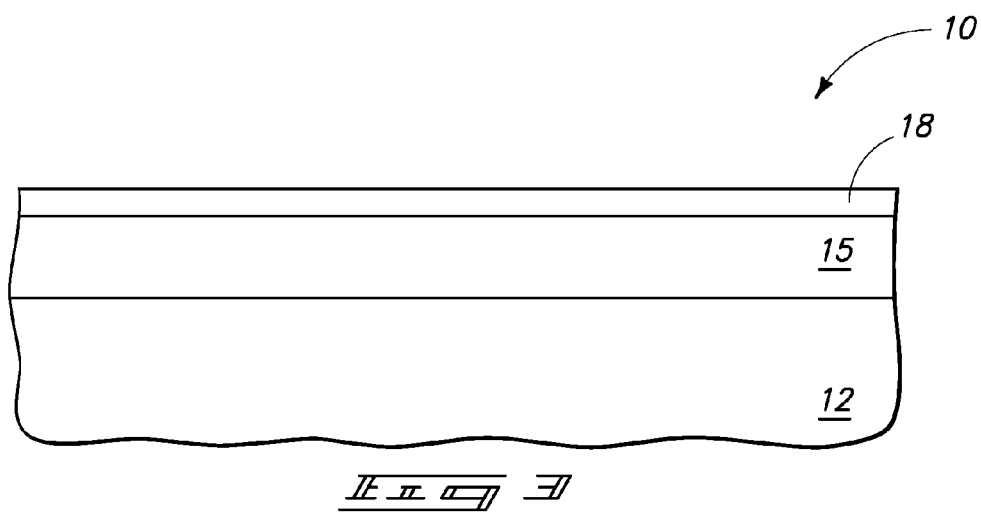
FIG. 3 is a view of the FIG. 2 substrate fragment at a processing step subsequent to that shown by FIG. 2.

Example embodiments of forming a non-volatile resistive oxide memory cell and of forming a non-volatile resistive oxide memory array are initially described with reference to FIGS. 1-10. Referring initially to FIGS. 1 and 2, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises material 12 over which a series of conductive lines 13, 14 and 15 has been fabricated. Multiple different materials and layers would likely be present at least below material 12, and may for example comprise bulk semiconductor processing, semiconductor-on-insulator processing, or other substrates in process and whether existing or yet-to-be developed. In one example, material 12 is insulative, for example doped and/or undoped silicon dioxide. Insulative material 12 is also shown as being received between conductive lines 13, 14 and 15. Conductive lines 13, 14 and 15 may be comprised of one or more conductive materials and/or layers, including conductively doped semiconductive material.

Portions of each of conductive lines 13, 14 and 15 will comprise a first conductive electrode of a memory cell which will be fabricated. A plurality of non-volatile resistive oxide memory cells may be fabricated within a memory array, thereby for example perhaps millions of such individual memory cells being fabricated at essentially the same time. Further, each of conductive lines 13, 14 and 15 may constitute a first conductive electrode of multiple different memory cells, as will be apparent in the continuing discussion. Conductive lines 13, 14 and 15 comprise an example of a plurality of one of conductive word lines or conductive bit lines which have been formed over a substrate. In other words, each of the depicted conductive lines 13, 14 and 15 will comprise conductive word lines or each of conductive lines 13, 14 and 15 will comprise conductive bit lines. In the depicted and but one example embodiment, the lines 13, 14 and 15 run in respective straight lines within the array, although other configurations are of course contemplated.

Referring to FIG. 3, a metal oxide-comprising material 18 has been formed over first conductive electrode 15, and accordingly over the one of conductive word lines 13, 14, and 15 or conductive bit lines 13, 14, and 15. Material 18 may or may not comprise an outermost planar surface. Material 18 may be homogenous or non-homogenous, and may comprise one or more different compositions and/or layers. Accordingly, material 18 may be deposited/formed in one or more steps. By ways of example only, material 18 might comprise multi-resistive state metal oxide-comprising material, further for example comprising two different layers or regions generally regarded as or understood to be active or passive regions, although not necessarily. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, multi-resistive state metal oxide-comprising material 28 might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187, 201, as well as in U.S. Patent Application Publication Nos. 2006/0171200 and 2007/0173019, the disclosures of which are hereby fully incorporated herein by reference for all purposes of this disclosure. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed. Further, metal oxide-comprising material 18 might be configured to have its current leakage capabilities be selectively varied in addition to or instead of its resistive state.

Figure 4:
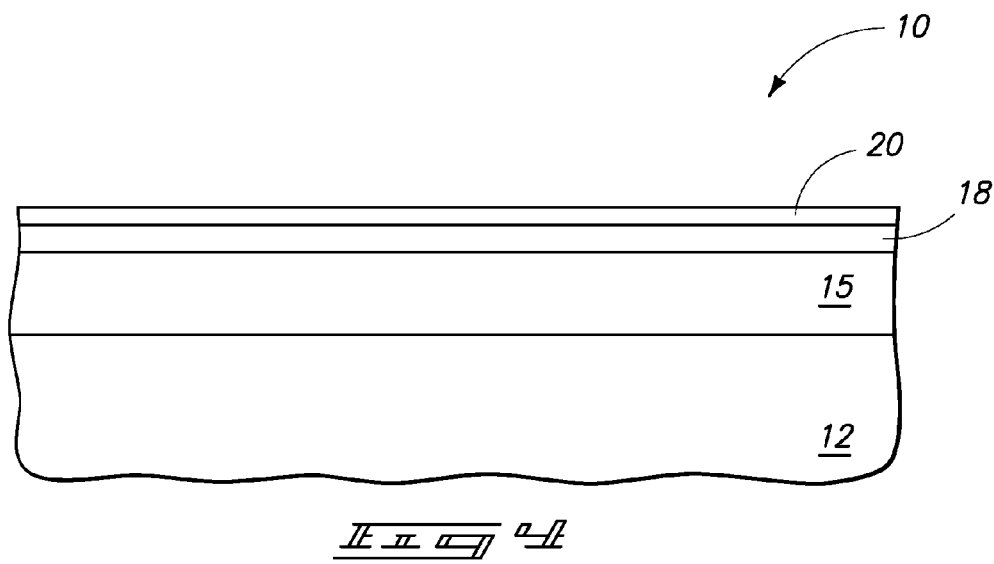
FIG. 4 is a view of the FIG. 3 substrate fragment at a processing step subsequent to that shown by FIG. 3.

Referring to FIG. 4, etch stop material 20 has been deposited over metal oxide-comprising material 18. In one embodiment and as shown, etch stop material is homogenous and in one embodiment is completely blanketly covering over metal oxide-comprising material 18. Regardless, etch stop material 20 will be used to provide an etch stopping function when etching a subsequently deposited conductive material, as will be described below. In one embodiment, etch stop material 20 comprises an inherently/always electrically conductive material, for example an inherently/always electrically conductive metal oxide. By ways of examples only, inherently/always electrically conductive materials include indium tin oxide, TiN, oxygen doped TiN, and $RuO_2$. Accordingly, etch stop material 20 may comprise one or more of such compositions.

In one embodiment, etch stop material 20 is of an electrically insulative composition yet is of an effective thinness in such instances to be electrically conductive through such composition. Composition of etch stop material 20 in such instances will determine maximum thickness of material 20 in a finished circuitry construction to enable electrical conduction through such composition. Example electrically insulative compositions for etch stop material 20 comprise at least one of silicon dioxide, silicon nitride, silicon oxynitride, silicon carbide, and titanium dioxide. In some embodiments, etch stop material 20 has a thickness no greater than 200 Angstroms in a finished circuitry construction incorporating the memory cell or cells being fabricated, and in one embodiment no greater than 100 Angstroms in such finished circuitry construction. In one embodiment, an example thickness range for etch stop material 20 in a finished circuitry construction incorporating such etch stop material is from 50 Angstroms to 200 Angstroms, although thicknesses less than 50 Angstroms are also of course contemplated.

Figure 5:
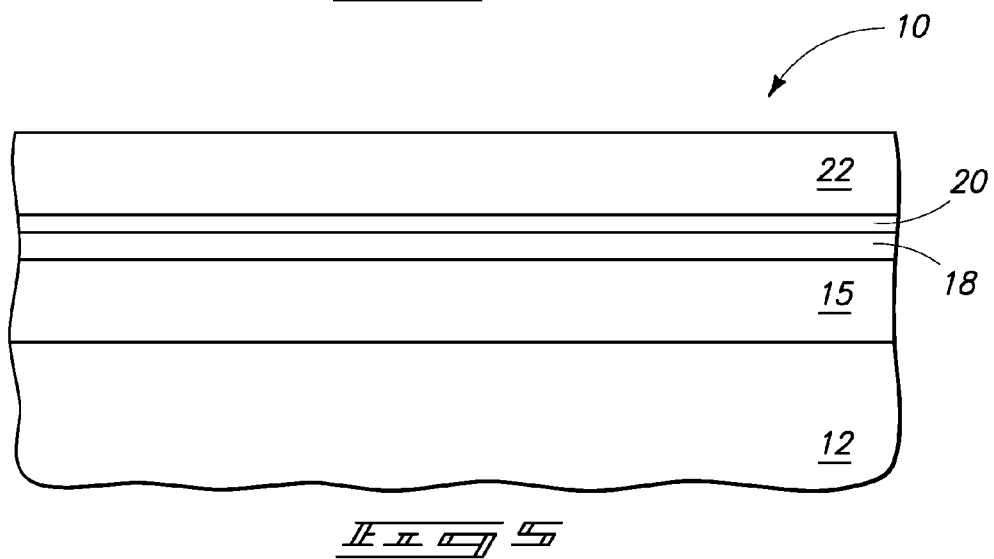
FIG. 5 is a view of the FIG. 4 substrate fragment at a processing step subsequent to that shown by FIG. 4.

Referring to FIG. 5, conductive material 22 has been deposited over etch stop material 20. Conductive material 22 may be homogenous or non-homogenous, and regardless be of the same or different composition from that of conductive material of first electrode 15.

Referring to FIGS. 6 and 7, a plurality of the other of conductive word lines 24, 25, 26 or conductive bit lines 24, 25, 26 has been formed from conductive material 22. An example technique for forming conductive lines 24, 25, and 26 comprises photolithographic patterning of an imageable material, such as photoresist, followed by develop and subsequent subtractive etch of material 22 to produce the FIGS. 6 and 7 construction. Portions of each of lines 24, 25, and 26 will comprise second conductive electrodes of the respective memory cells being fabricated. Regardless, the forming of the second conductive electrode 24, 25, and 26 of a respective memory cell comprises etching through conductive material 22 to stop etching action relative to etch stop material 20. Accordingly, etch stop material 20 provides an effective etch stopping function when etching through material 22 to form the depicted plurality of the other of conductive word lines 24, 25, 26 or conductive bit lines 24, 25, 26.

By way of example only, FIGS. 6 and 7 depict respective non-volatile resistive oxide memory cells 30 which comprise a portion of conductive line 15 which comprises a first conductive electrode of the respective memory cells, and a second conductive electrode comprising portions of one of the depicted conductive lines 24, 25, and 26. The respective memory cells 30 also comprise both metal oxide-comprising material 18 and etch stop material 20 which are received between the respective first and second conductive electrodes of the respective memory cells. Accordingly, etch stop material 20 comprises a part of the finished circuitry construction incorporating an individual memory cell. In the depicted and example but one embodiment, etch stop material 20 is completely blanketly covering between metal oxide-comprising material 18 and the overlying second conductive electrode in a finished circuitry construction incorporating the memory cell. In one embodiment wherein etch stop material 20 is of an electrically insulative composition, such material 20 is of an effective thinness between the respective first and second conductive electrodes to be electrically conductive through such composition when a multi-resistive state metal oxide-comprising material 18 is in a lowest resistive state, thereby for example for a binary memory cell enabling such cell to be switchable between "on" and "off" conditions.

In embodiments where etch stop material 20 is conductive, such is removed sufficiently (not shown in FIGS. 6 and 7) between/among memory cells 30 to preclude electrical shorting of different memory cells 30. In embodiments where etch stop material 20 is insulative, such may or may not need to be any of treated, removed partially, removed wholly, or not removed at all between/among memory cells 30 to preclude electrical shorting of different memory cells 30. Such may depend at least in part upon the dielectric properties of etch stop material 20 and/or spacing between adjacent memory cells 30. For example in the embodiment of FIGS. 6 and 7, composition of an insulative etch stop material 20 might be both (a) insufficiently resistive to enable conductivity between electrodes 22 and 15 when material 18 is in a lowest resistance state due in part to separation distance between electrodes 22 and 15 in a memory cell, and (b) sufficiently resistive between adjacent memory cells 30 due to greater separation distance therebetween as compared to the separation distance between electrodes 22 and 15 in a memory cell. Yet if condition (a) is satisfied and condition (b) is not, etch stop material 20 between memory cells 30 might be one or both of i) treated to increase resistivity thereof, or ii) thinned. Such might be desirable to minimize electrical interference between or among spaced memory cells 30, and further may be desirable even if both conditions (a) and (b) are satisfied. For example, segments of etch stop material 20 remaining between adjacent memory cells 30 might adversely or unpredictably impact programming voltage required to change states of material 18 in spaced memory cells 30. Thinning and/or treating to increase resistance of such material 20 between memory cells 30 might be used in such instances.

Regardless, different dielectric materials 20 can be deposited in one lower resistance state and treated after deposition to a second higher resistance state. For example, lower density of a given inherently/always dielectric material typically results in lower resistivity as compared to higher density of the same material. As one example, a low density silicon dioxide can be increased in density and resistance by treating with ozone with deionized water at elevated temperature. In another embodiment, etch stop material 20 can be removed to material 18 between memory cells 30 such that material 20 does not interconnect among individual memory cells 30.

In one embodiment, the act of etching through conductive material 22 to form the respective second conductive electrode portions of the memory cell stops on etch stop material 20 such that no detectable quantity of etch stop material 20 is etched during any of the etching of such conductive material 22. For example and by way of example only, FIG. 7 depicts a perfect selective etch of material 22 relative to etch stop material 20 such that none of etch stop material 20 is etched away after clearing conductive material 22 from between the depicted other of conductive word lines 24, 25, 26 or conductive bit lines 24, 25, 26.

Figure 8:
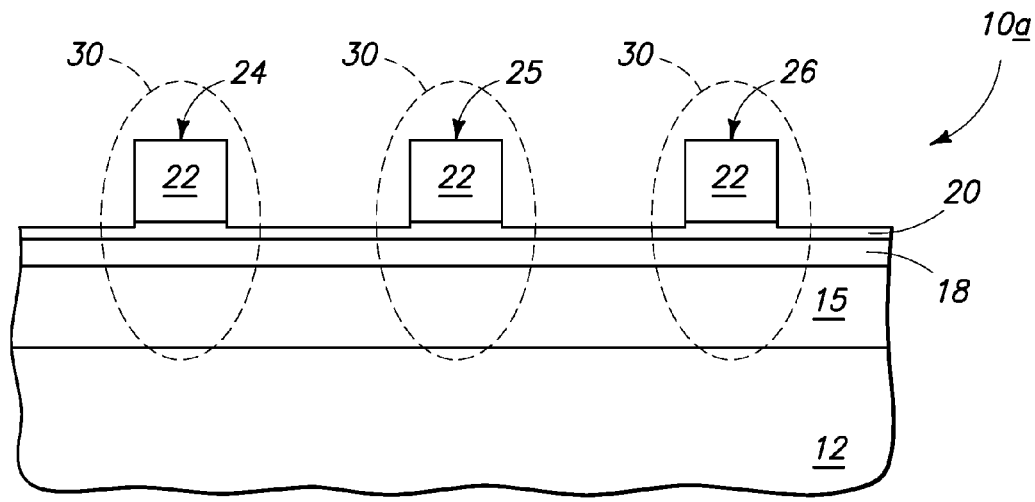
FIG. 8 is a cross sectional view of an alternate embodiment substrate fragment to that shown in FIG. 7.
Figure 9:
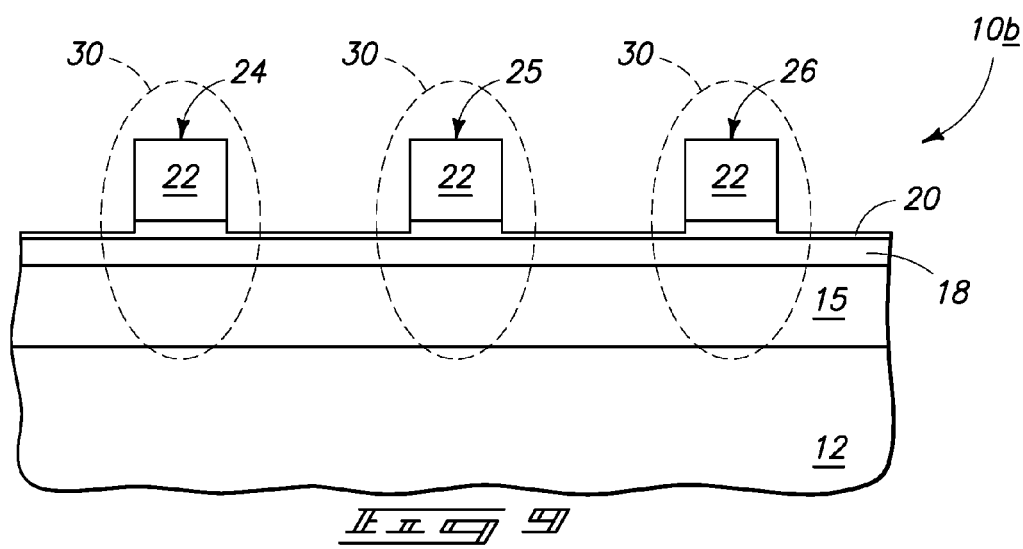
FIG. 9 is a cross sectional view of an alternate embodiment substrate fragment to those shown in FIGS. 7 and 8.

Yet an alternate embodiment comprises etching through conductive material 22 whereby etch stop material 20 is only partially etched into upon complete etching through material 22 between conductive lines 24, 25, and 26, and accordingly still providing an etch stopping function during the etch of conductive material 22. Such partial etching into etch stop material 20 while etching conductive material 22 might, for example, etch less or more than half of thickness of etch stop material 20, or about half of thickness of etch stop material 20. For example and by way of examples only, FIG. 8 illustrates an alternate embodiment substrate fragment 10a wherein etching of conductive material 22 has also etched partially into etch stop material 20 to less than half of the thickness of etch stop material 20. FIG. 9 illustrates an alternate embodiment substrate fragment 10b wherein etching through conductive material 22 has etched partially into etch stop material 20 to more than half of the thickness etch stop material 20. Regardless, any etching of etch stop material 20 while etching conductive material 22 may or may not result in some lateral recess of material 22 relative to one or both of the respective first and second conductive electrodes, whereby the etch stop material may not be completely blanketly covering between the metal oxide-comprising material and the second conductive electrode in a finished circuitry construction incorporating the memory cell. Regardless, subsequently deposited insulative and wiring layers (not shown as not being material to the inventions disclosed herein) would likely be provided over each of the substrates of FIGS. 7, 8, and 9 in respective finished circuitry constructions.

Figure 10:
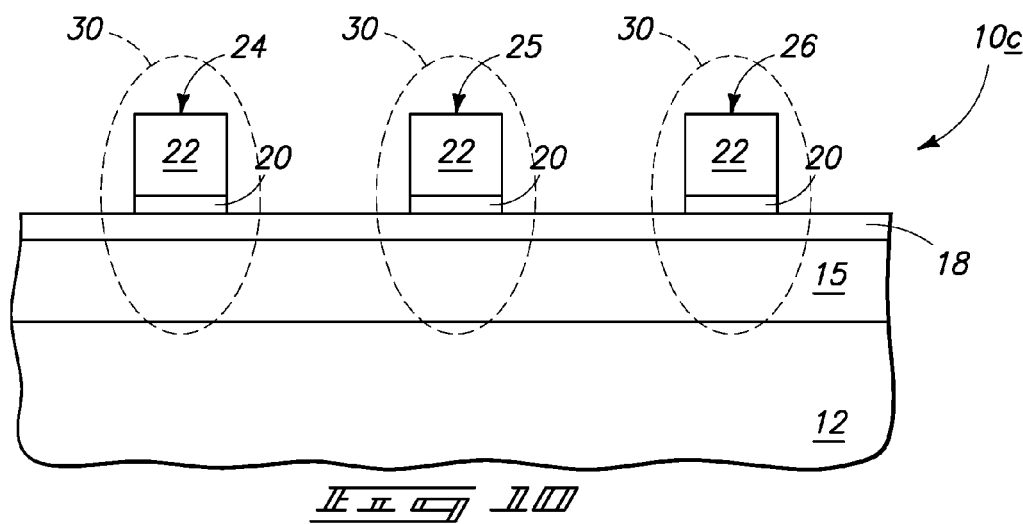
FIG. 10 is a cross sectional view of an alternate embodiment substrate fragment to those shown in FIG. 7-9.

In some embodiments, methods of forming a non-volatile resistive oxide memory cell and/or memory array are void of exposing any of metal oxide-comprising material 18 to any etching plasma, for example as may be desirable to overcome one or more problems identified in the Background section above. Alternately in some embodiments, metal oxide-comprising material 18 may be exposed to an etching plasma. Regardless, some embodiments of the invention also contemplate etching through etch stop material 20 laterally outward of the second conductive electrode to the metal oxide-comprising material after etching through the conductive material and using the etch stopping attribute or act relative to the etch stop material. For example, FIG. 10 illustrates an alternate embodiment substrate fragment 10c which could result from subsequent processing of any of the substrate fragments 10, 10a, or 10b of FIGS. 7, 8, and 9, respectively. Substrate fragment 10c in FIG. 10 has been processed to etch through etch stop material 20 laterally outward of each of the depicted second conductive electrodes 24, 25, and 26 to metal oxide-comprising material 18. Such subsequent etching of etch stop material 20 may or may not be conducted selectively relative to metal oxide-comprising material 18, and may or may not comprise wet, dry, and/or plasma etching.

In the above depicted and described example embodiments, programmable junctions or memory cells manifest where the respective word lines and bit lines cross one another. Further by way of example only and as shown in the above embodiments, the plurality of the other of conductive word lines 24, 25, 26 or conductive bit lines 24, 25, 26 run generally parallel an outer major surface of the substrate (as do the plurality of one of conductive word lines 13, 14, 15 or conductive bit lines 13, 14, 15), and are angled relative to the plurality of such one of word lines 13, 14, 15 or bit lines 13, 14, 15. The outermost surface of the respective substrates may or may not be planar at certain or any points during processing. Regardless, the above-described and depicted substrates at their respective largest or global scales can be considered as having some respective outer major surface that can be considered, on average, as defining some general horizontal plane relative to which the various layers and circuitry components are fabricated. Such outer major surface of the respective substrates may, of course, be comprised of more than one composition at different points in processing of the respective substrates. Further, the outer major surface of the respective substrates can be considered as averaging to be planar throughout fabrication, with such general plane rising and lowering as the circuitry is fabricated.

Figure 11:
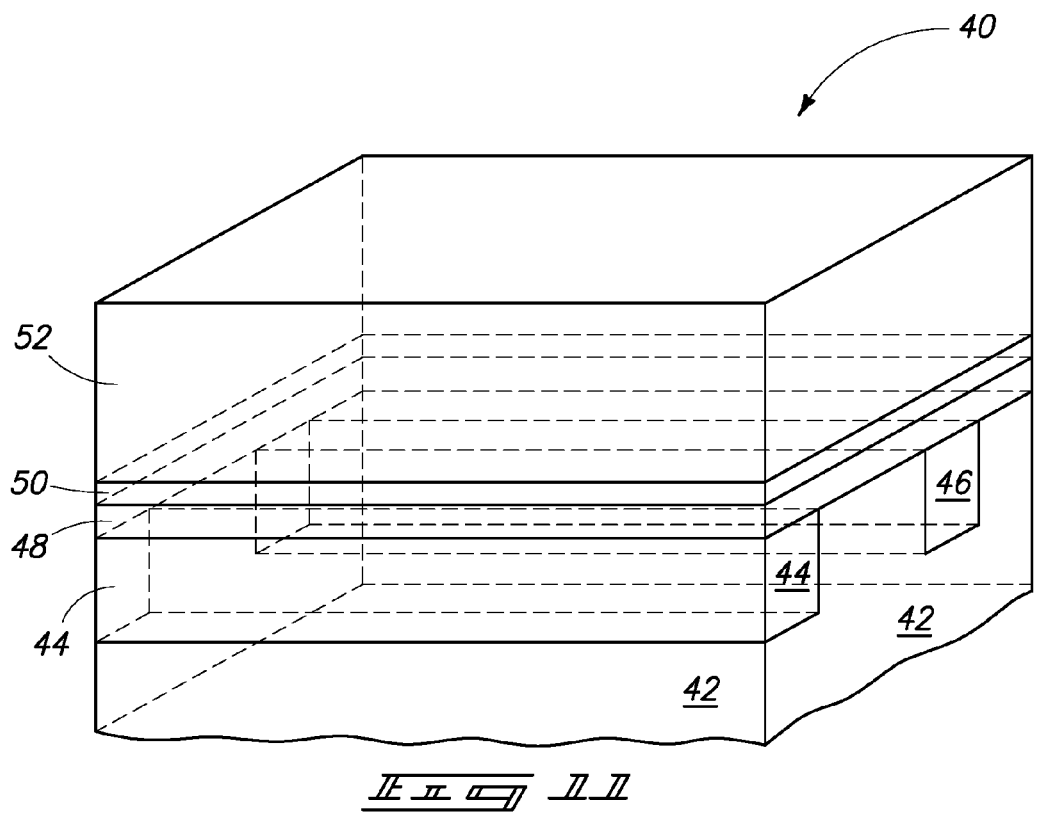
FIG. 11 is a diagrammatic isometric view of a semiconductor substrate fragment in process in accordance with an embodiment of the invention.

By ways of examples only, alternate exemplary embodiments of methods of forming a non-volatile resistive oxide memory cell and/or array are next described with reference to FIGS. 11-19. Referring initially to FIG. 11, a substrate fragment is indicated generally with reference numeral 40. Such comprises material 42 relative to which a series of conductive lines has been fabricated, for example lines 44 and 46. As above, multiple different materials and layers would likely be present at least below material 42 (as in accordance with material 12 in the above-described embodiments), and may for example comprise bulk semiconductor processing, semiconductor-on-insulator processing, or other substrates in process and whether existing or yet-to-be developed. In one example, material 42 is insulative, for example doped and/or undoped silicon dioxide. Insulative material 42 is also shown as being received between conductive lines 44 and 46. Conductive lines 44 and 46 may be comprised of one or more conductive materials and/or layers, including conductively doped semiconductive material.

Portions of each of conductive lines 44 and 46 will comprise a first conductive electrode of a respective memory cell which will be fabricated. As in the above-described embodiments, a plurality of non-volatile resistive oxide memory cells may be fabricated within a memory array, thereby for example perhaps millions of such individual memory cells being fabricated at essentially the same time. Further, each of conductive lines 44 and 46 may constitute a first conductive electrode of multiple different memory cells. Conductive lines 44 and 46 comprise an example of a plurality of one of conductive word lines or conductive bit lines which have been formed over a substrate. In other words, each of the depicted conductive lines 44 and 46 will comprise conductive word lines or each of conductive lines 44 and 46 will comprise conductive bit lines. In the depicted and but one example embodiment, lines 44 and 46 run in respective straight lines within the array, although other configurations are of course contemplated.

Metal oxide-comprising material 48 has been formed over the one of conductive word lines 44, 46 or conductive bit lines 44, 46. Example materials and constructions are as described above in the first-described embodiments with respect to material 18.

Etch stop material 50 has been deposited over metal oxide-comprising material 48. Example compositions and constructions are as described above in the first-described embodiments in connection with etch stop material 20. However, none or some of etch stop material 20 may remain in a finished circuitry construction of a non-volatile resistive oxide memory cell in the embodiments of FIGS. 11-19, as will be apparent from the continuing discussion.

Damascene template material 52 has been deposited over etch stop material 50. By ways of example only, example damascene template materials include at least one of amorphous carbon, transparent carbon, photoresist, silicon nitride, silicon dioxide (whether doped or undoped and including silicate glasses) and polysilicon (whether doped or undoped).

Figure 12:
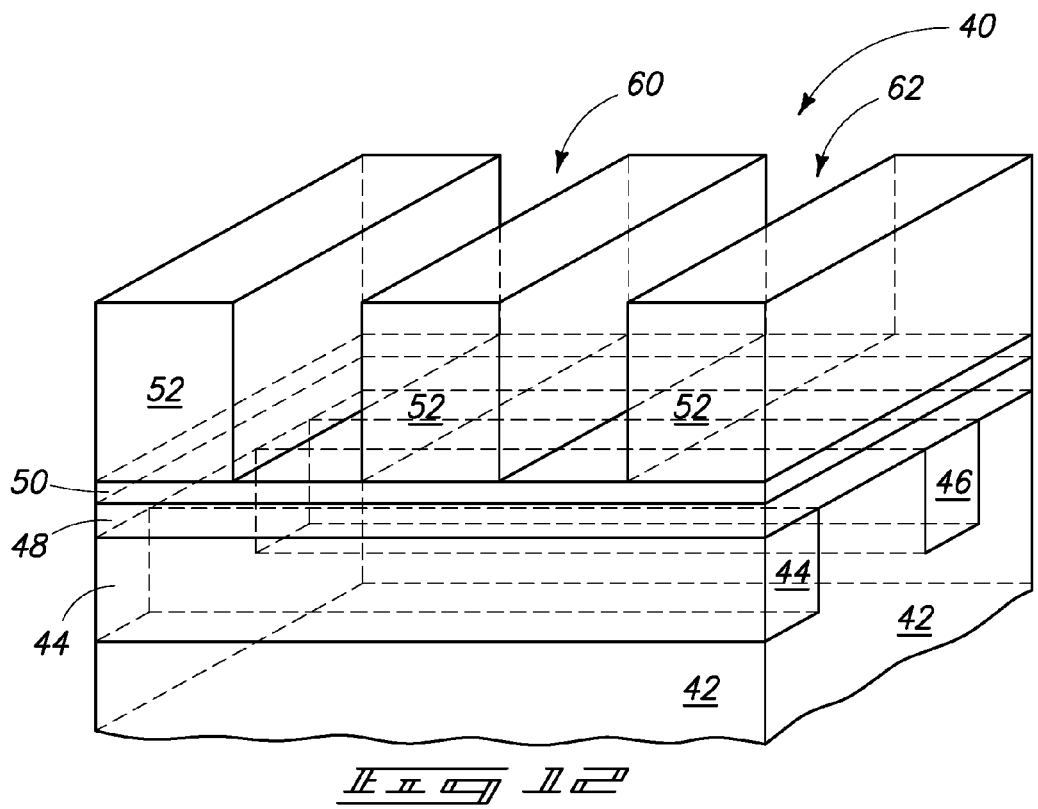
FIG. 12 is a view of the FIG. 11 substrate fragment at a processing step subsequent to that shown by FIG. 11.

Referring to FIG. 12, a series of elongated trenches 60, 62 has been etched into damascene template material 52 to etch stop material 50 over the plurality of the one of word lines 44, 46 or bit lines 44, 46 to stop relative to etch stop material 50. In one embodiment and alternately considered, for example considered in the fabrication of a single non-volatile resistive oxide memory cell, either of trenches 60, 62 might be considered as an opening which has been etched through damascene template material 52 to etch stop material 50 over a first conductive electrode comprised of a portion of either of conductive lines 44, 46 to stop relative to etch stop material 50. Accordingly in the depicted embodiment, such example openings respectively comprise an elongated trench in the damascene template material which runs generally parallel an outer major surface of the substrate, and which is angled relative to the plurality of the one of word lines 44, 46 or bit lines 44, 46. Some of etch stop material 50 might also be etched into while still providing an etch stopping function.

Figure 13:
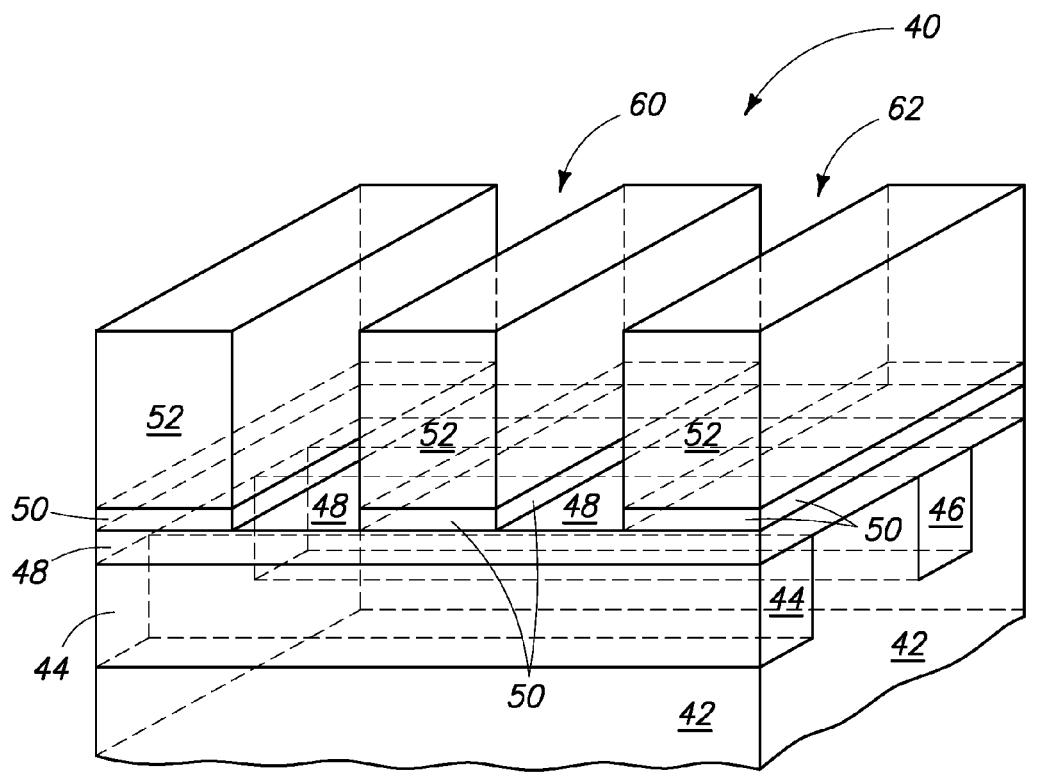
FIG. 13 is a view of the FIG. 12 substrate fragment at a processing step subsequent to that shown by FIG. 12.

Referring to FIG. 13, etching has been conducted through etch stop material 50 within the respective openings 60, 62 to metal oxide-comprising material 48. Any suitable wet or dry etching chemistry might be utilized. In one embodiment, such etching does not utilize any etching plasma such that the process is void of exposing metal oxide-comprising material 50 within the respective openings 60, 62 to any etching plasma, for example to overcome one or more of the problems identified in the Background section above. By way of example only where, for example, the etch stop material comprises silicon dioxide, a suitable dry non-plasma etching chemistry comprises use of $NH_3$ and HF vapors, and/or $NF_3$ radicals. Regardless, in one embodiment, ion implanting of a suitable substance might be conducted into etch stop material 50 within the respective opening 60, 62, or even before deposition of damascene template material 52, to facilitate ease of etching of etch stop material 50 from within the respective openings 60, 62. Regardless, in some embodiments, etching of etch stop material 50 within openings 60, 62 may or may not recess material 50 laterally beneath damascene template material 52. If such lateral recessing occurs and produces a less than desirable resultant outline, subsequent etching might be conducted at least of the sidewalls of damascene template material 52 to remove or reduce such recesses.

Figure 14:
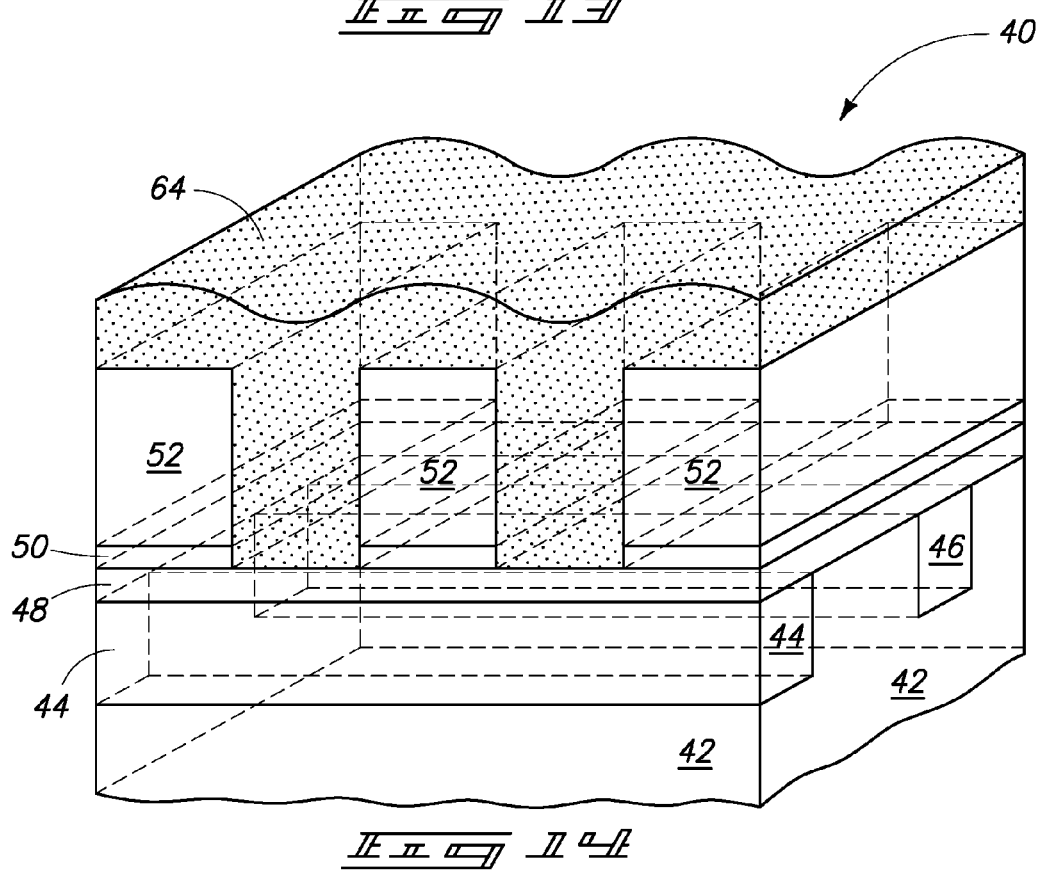
FIG. 14 is a view of the FIG. 13 substrate fragment at a processing step subsequent to that shown by FIG. 13.
Figure 15:
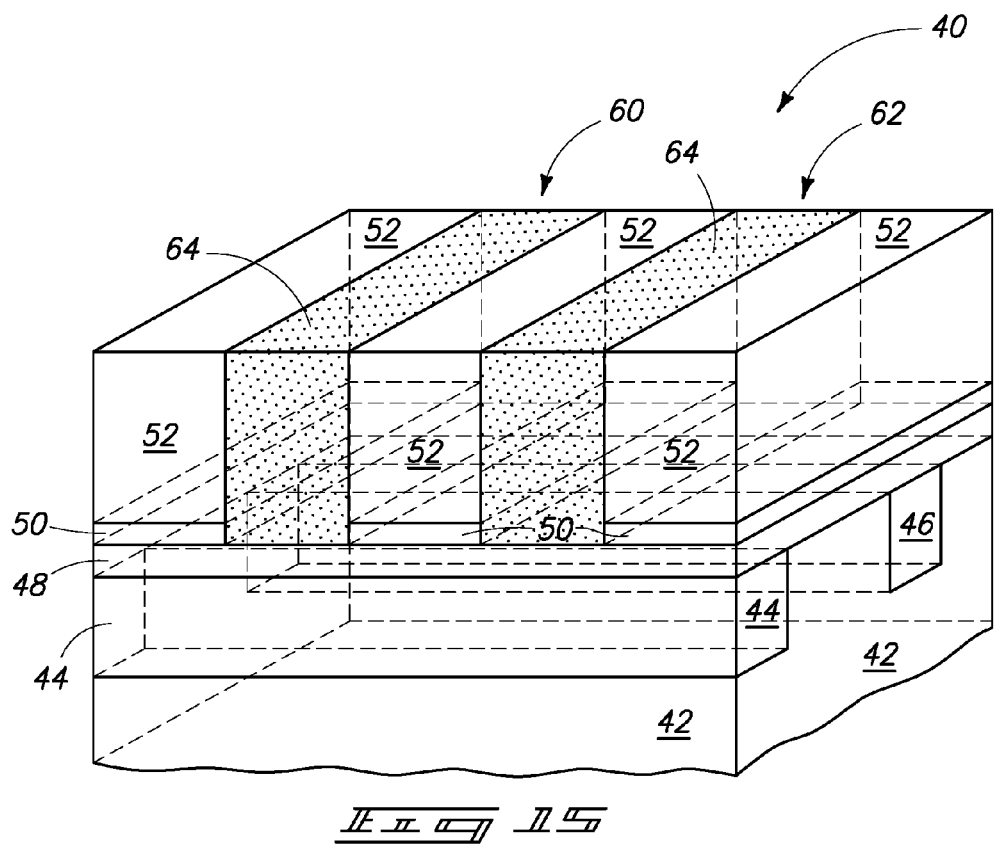
FIG. 15 is a view of the FIG. 14 substrate fragment at a processing step subsequent to that shown by FIG. 14.
Figure 16:
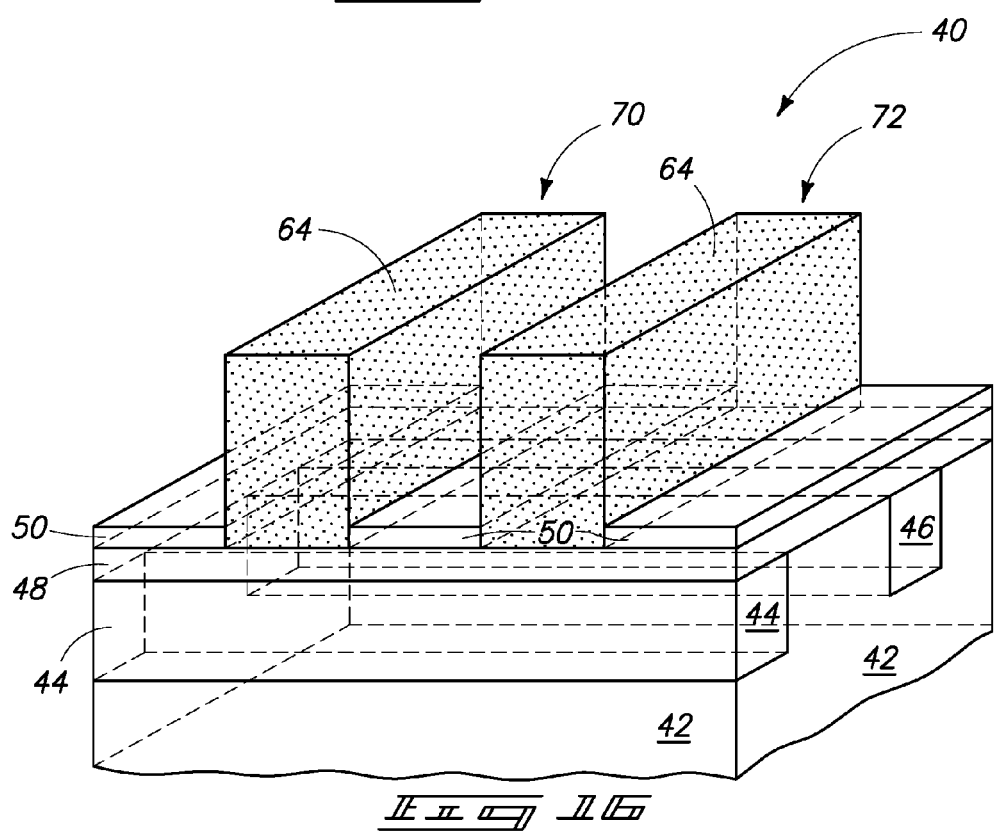
FIG. 16 is a view of the FIG. 15 substrate fragment at a processing step subsequent to that shown by FIG. 15.

Referring to FIGS. 14 and 15, conductive material 64 has been deposited to within the respective opening 60, 62 over metal oxide-comprising material 48 and the respective first conductive electrodes 44, 46. FIGS. 14 and 15 depict an example embodiment whereby conductive material 64 has been deposited to overfill the respective openings/trenches 60, 62, and then polished back to at least an outermost surface of damascene template material 52. In the depicted example embodiment wherein a non-volatile resistive oxide memory array is also fabricated, a plurality of the other of conductive word lines 70, 72 (FIG. 16) or conductive bit lines 70, 72 has been formed from conductive material 64.

Some or all of damascene template material 52 may remain as part of the finished circuitry construction where such is of a desired insulative material. Alternately and by way of example only and referring to FIG. 16, all remaining of damascene template material 52 (not shown) has been removed from the substrate.

Figure 17:
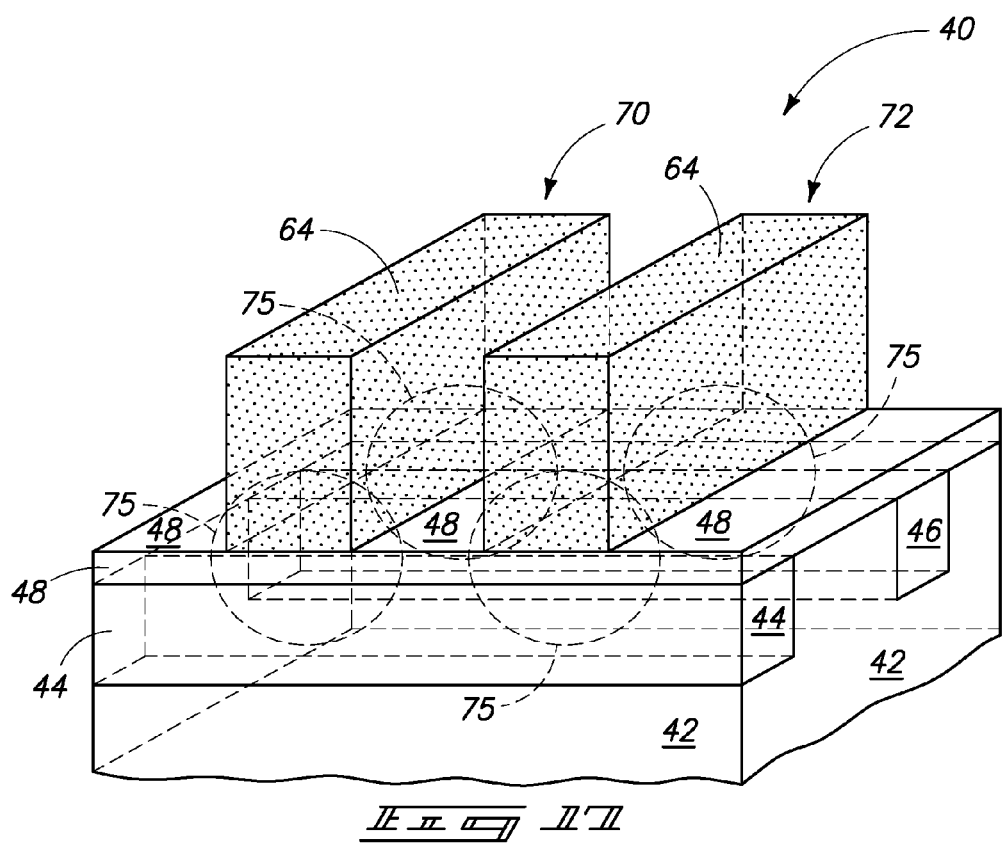
FIG. 17 is a view of the FIG. 16 substrate fragment at a processing step subsequent to that shown by FIG. 16.

Some, none, or all of remaining etch stop material 50 may be removed from the substrate, with FIG. 17 showing an example embodiment wherein all such remaining etch stop material 50 (not shown) has been removed from the substrate. Regardless, metal oxide-comprising material 48 between the one of word lines 44, 46 or bit lines 44, 46 and the other of word lines 70, 72 or bit lines 70, 72 form individually programmable junctions where the word lines and bit lines cross one another, thereby forming the depicted example individual non-volatile resistive oxide memory cells 75.

By ways of example only, the above-described embodiments depict non-volatile resistive oxide memory cells and memory arrays where word lines and bit lines cross one another without isolation patterning of the metal oxide-comprising material and without a conductive projection extending from one or both of the word lines or bit lines for each memory cell. However of course, embodiments of the invention encompass incorporating these or other features in a memory cell or an array of memory cells. For example, the metal oxide-comprising material might be patterned relative to one or a plurality of memory cells, and/or one or more conductive projections might be provided relative to the respective word lines and/or bit lines.

Figure 18:
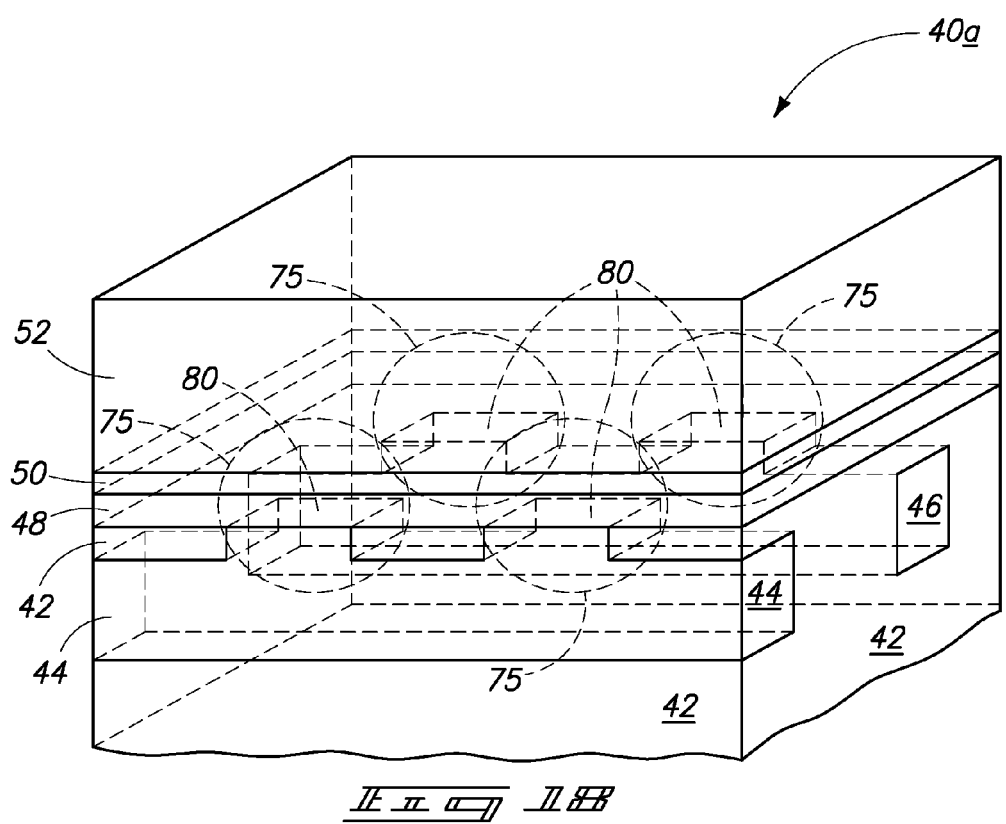
FIG. 18 is a diagrammatic isometric view of a semiconductor substrate fragment in process in accordance with an embodiment of the invention.
Figure 19:
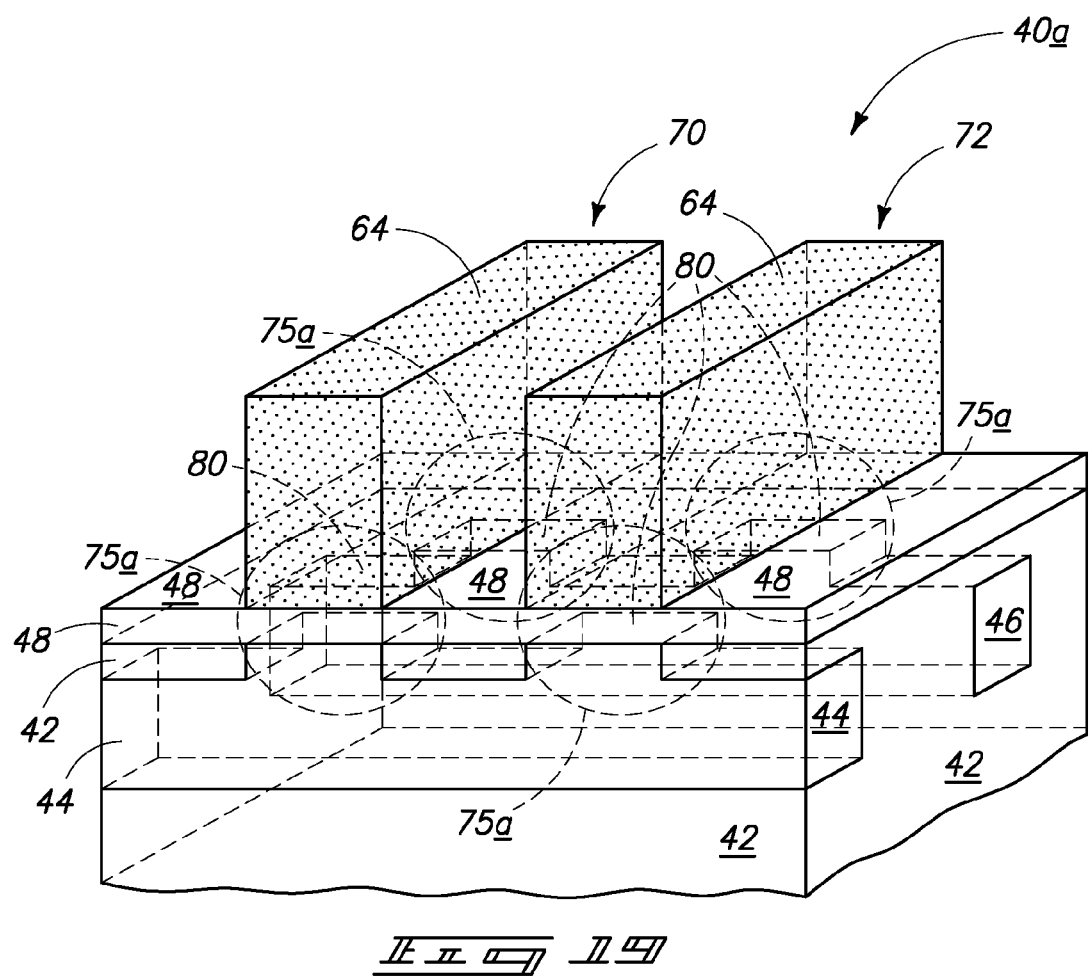
FIG. 19 is a view of the FIG. 18 substrate fragment at a processing step subsequent to that shown by FIG. 18.

By way of example only, FIGS. 18 and 19 depict an alternate exemplary embodiment with respect to a substrate fragment 40a. Like numerals from the FIGS. 11-17 embodiment have been utilized where appropriate, with differences being indicated with the suffix "a" or with different numerals. FIG. 18 corresponds in processing sequence to FIG. 11 of the substrate fragment embodiment of FIG. 11, yet wherein a plurality of respective conductive projections 80 extend upwardly from word lines 44, 46 or bit lines 44, 46. Accordingly in one example embodiment, such comprise first conductive electrodes of respective non-volatile resistive oxide memory cells. Such conductive projection extending upwardly from a conductive line 44, 46 may be of the same or different composition from that of the conductive line. By way of example only, conductive lines 44, 46 and respective projections 80 are depicted as being of the same composition, and may comprise one or more conductive materials including conductively doped semiconductive material. An example manner of fabricating conductive lines 44, 46 to include projections 80 includes initial deposition of one or more conductive materials to a thickness at or greater than the thickness of a conductive projection including that of the underlying conductive line. The outline of the conductive lines can then be patterned. This can be followed by cross patterning of the conductive projections using a timed etch into the conductive material from which such projections and lines are formed. Other manners of fabrication might be used.

Regardless, FIG. 19 depicts an analogous construction to that of FIG. 17 but additionally incorporating projections 80 to thereby form individual non-volatile resistive oxide memory cells 75a. Nevertheless and regardless, such still defines or forms a non-volatile resistive oxide memory array comprising metal oxide-comprising material received between the one of the word lines or bit lines and the other of the word lines or bit lines to form individually programmable junctions where the word lines and bit lines cross one another. Of course alternately or in addition thereto, downward projections might be provided from the overlying conductive lines 70, 72. Further, either or both of such projection concepts and/or isolation patterning of metal oxide-comprising material might be incorporated in any of the above-described FIGS. 1-10 embodiments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a non-volatile resistive oxide memory cell, comprising:
    forming a conductive electrode of the memory cell as part of a substrate;
    forming metal oxid-comprising material over the first conductive electrode;
    depositing etch stop material over the metal oxide-comprising material, the etch stop material comprising silicon dioxide;
    depositing damascene template material over the etch stop material;
    etching an opening through the damascene template material to the etch stop material over the first electrode to stop relative to the etch stop material;
    after etching the opening through the damascene template material to the etching the material over the first electrode to stop relative to the etch stop material, etching through the etch stop material within the opening to the metal oxide-comprising material, the etching through the etch stop material comprising using at least one of a) NH$_3$ and HF vapors, and b) NF$_3$ radicals; and after etching through the etch stop material within the opening to the metal oxide-comprising material, depositing conductive material to within the opening over the metal oxide-comprising material and the first conductive electrode and forming a second conductive electrode of the memory cell from the conductive material.

2. The method of claim 1 comprising after etching the opening through the damascene template material to the etch stop material over the first electrode to stop relative to the etch stop material and before etching through the etch stop material within the opening to the metal oxide-comprising material, ion implanting a substance into the etch stop material within the opening.

3. The method of claim 1 being void of exposing said metal oxide-comprising material within the opening to any etching plasma.

4. The method of claim 1 being void of exposing said metal oxide-comprising material to any etching plasma.

5. The method of claim 1 wherein the opening comprises an elongated trench in the damascene template material that runs generally parallel an outer major surface of the substrate.

6. The method of claim 1 wherein the etch stop material further comprises at least one of, silicon nitride, silicon oxynitride, silicon carbide, and titanium dioxide.

7. A method of forming a non-volatile resistive oxide memory cell, comprising:

forming a first conductive electrode of the memory cell as part of a substrate;

forming metal oxide-comprising material over the first conductive electrode;

depositing etch stop material over the metal oxide-comprising material;

depositing damascene template material over the etch stop material;

etching an opening through the damascene template material to the etch stop material over the first electrode to stop relative to the etch stop material;

after etching the opening through the damascene template material to the etch stop material over the first electrode to stop relative to the etch stop material, etching through the etch stop material within the opening to the metal oxide-comprising material;

after etching through the etch material within the opening to the metal oxide-comprising material, depositing conductive material to within the opening over the metal oxide-comprising material and the first conductive electrode and forming a second conductive electrode of the memory cell from the conductive material; and after depositing the conductive material, removing all remaining of said damascene template material from the substrate.

8. The method of claim 7 wherein the damascene template material comprises at least one of transparent carbon, photoresist, silicon nitride, silicon dioxide, and polysilicon.

9. The method of claim 7 comprising after depositing the conductive material and before removing all remaining of said damascene template material, polishing the conductive material back to at least an outermost surface of the damascene template material.

10. The method of claim 7 wherein the metal oxide-comprising material comprises multi-resistive state metal oxide-comprising material.

11. A method of forming a non-volatile resistive oxide memory array, comprising:

forming a plurality of one of conductive word lines or conductive bit lines over a substrate;

forming multi-resistive state metal oxide-comprising material over the one of conductive word lines or conductive bit lines;

depositing etch stop material over the multi-resistive state metal oxide-comprising material;

depositing damascene template material over the etch stop material;

etching a series of elongated trenches into the damascene template material to the etch stop material over the plurality of said one of word lines or bit lines to stop relative to the etch stop material, the trenches running generally parallel an outer major surface of the substrate, the trenches being angled relative to the plurality of said one of word lines or bit lines;

after etching said elongated trenches to stop relative to the etch stop material, etching through the etch stop material within the elongated trenches to the multi-resistive state metal oxide-comprising material;

after etching through the etch stop material within the elongated trenches to the multi-resistive state metal oxide-comprising material, depositing conductive material to within the elongated trenches over the multi-resistive state metal oxide-comprising material and the one of conductive word lines or conductive bit lines, and forming a plurality of the other of conductive word lines or conductive bit lines from the conductive material;

providing said multi-resistive state metal oxide-comprising material between said one of word lines or bit lines and said other of word lines or bit lines to form individually programmable junctions where the word lines and bit lines cross one another;

retaining portions of the etch stop material extending laterally between the other of the conductive word lines or conductive bit lines in a finished circuitry structure; and after depositing the conductive material, removing all remaining of said damascene template material from the substrate.

12. The method of claim 11 wherein the metal oxide of the metal oxide comprising material comprises one or more member selected from the group consisting of Sr$_x$Ru$_y$O$_z$, RuO$_y$, In$_x$Sn$_y$O$_z$, and CaMnO$_3$.

13. A method of forming a non-volatile resistive oxide memory cell, comprising:

forming a first conductive electrode of the memory cell as part of a substrade;

forming metal oxide-comprising material over the first conductive electrode;

depositing etch stop material over the metal oxide-comprising material;

depositing damascene template material over the etch stop material;

etching an opening through the damascene template material to the etch stop material over the first electrode to stop relative to the etch stop material;

etching through the etch stop material within the opining to the metal oxide-comprising material while retaining laterally extending regions of the etch stop material, at least a portion of the laterally extending regions being retained in a final memory cell structure;

depositing conductive material to within the opening over the metal oxide-comprising material; and modifying the laterally extending regions of etch stop material, the modifying comprising at least one of treating the etch stop material to increase resistivity and removal of part of a thickness of the extending portions of etch stop material.

14. The method of claim 13 wherein the metal oxide-comprising material is formed in direct physical contact with the first conductive electrode.

15. The method of claim 13 wherein the metal oxide of the metal oxide comprising material comprises one or more member selected from the group consisting of $Sr_xRu_yO_z$, $RuO_y$, $In_xSn_yO_z$, and $CaMnO_3$.

16. The method of claim 13 wherein the etch stop is deposited in direct physical contact with the metal oxide-comprising material.

17. The method of claim 13 wherein the first conductive electrode comprises doped semiconductive material.

* * * * *

UNITED STATES PATENT AND TRADEMARK OFFICE
CERTIFICATE OF CORRECTION

| | | |
|---|---|---|
| PATENT NO. | : 9,666,801 B2 | Page 1 of 1 |
| APPLICATION NO. | : 15/156105 | |
| DATED | : May 30, 2017 | |
| INVENTOR(S) | : Nishant Sinha et al. | |

It is certified that error appears in the above-identified patent and that said Letters Patent is hereby corrected as shown below:

In the Claims

Column 10, Line 51 – Replace "a conductive" with --a first conductive--

Column 10, Line 64 – Replace "the etching the material" with --the etch stop material--

Column 11, Line 26 – Replace "one of, silicon" with --one of silicon--

Column 11, Line 46 – Replace "the etch material" with --the etch stop material--

Column 12, Lines 35-36 – Replace "lines and
bit lines" with --lines and bit lines--

Column 12, Line 45 – Replace "oxide comprising" with --oxide-comprising--

Column 12, Line 46 – Replace "member selected" with --members selected--

Column 12, Line 66 – Replace "material to within" with --material within--

Column 13, Line 10 – Replace "oxide comprising" with --oxide-comprising--

Column 13, Line 11 – Replace "member selected" with --members selected--

Signed and Sealed this
Eighteenth Day of July, 2017

Joseph Matal
*Performing the Functions and Duties of the
Under Secretary of Commerce for Intellectual Property and
Director of the United States Patent and Trademark Office*